(12) United States Patent  
Thomas et al.

(10) Patent No.: US 7,198,979 B2
(45) Date of Patent: Apr. 3, 2007

(54) METHOD FOR MANUFACTURING A STACK ARRANGEMENT OF A MEMORY MODULE

(75) Inventors: Jochen Thomas, Munich (DE); Wolfgang Hetzel, Nattheim (DE); Ingo Wennemuth, Munich (DE)

(73) Assignee: Infineon Technologies AG, Munich (DE)

( * ) Notice: Subject to any disclaimer, the term of this patent is extended or adjusted under 35 U.S.C. 154(b) by 161 days.

(21) Appl. No.: 10/701,742

(22) Filed: Nov. 4, 2003

(65) Prior Publication Data

US 2004/0126910 A1 Jul. 1, 2004

(30) Foreign Application Priority Data

Nov. 4, 2002 (DE) ................. 102 51 527

(51) Int. Cl.
H01L 21/00 (2006.01)
H01L 21/46 (2006.01)
H01L 21/44 (2006.01)
H01L 23/02 (2006.01)
H01L 29/40 (2006.01)

(52) U.S. Cl. .................. 438/107; 438/33; 438/68; 438/106; 438/109; 438/110; 438/113; 438/458; 438/460; 438/617; 257/686; 257/777; 257/784

(58) Field of Classification Search ................ 257/666, 257/686, 777, 796, 706, 707; 438/107–112, 438/617
See application file for complete search history.

(56) References Cited

U.S. PATENT DOCUMENTS

| 4,567,643 | A | * | 2/1986 | Droguet et al. ............... 29/832 |
| 5,012,323 | A |   | 4/1991 | Farnworth |
| 5,953,216 | A | * | 9/1999 | Farnworth et al. .......... 361/777 |
| 6,229,217 | B1 | * | 5/2001 | Fukui et al. ................. 257/777 |
| 6,326,698 | B1 | * | 12/2001 | Akram ........................ 257/781 |
| 6,352,879 | B1 | * | 3/2002 | Fukui et al. ................. 438/106 |
| 6,495,442 | B1 |   | 12/2002 | Lin et al. |
| 6,531,784 | B1 | * | 3/2003 | Shim et al. ................. 257/777 |
| 6,538,313 | B1 | * | 3/2003 | Smith ......................... 257/684 |
| 6,541,846 | B2 | * | 4/2003 | Vaiyapuri .................... 257/676 |

(Continued)

FOREIGN PATENT DOCUMENTS

JP 8250651 9/1996

(Continued)

*Primary Examiner*—Carl Whitehead, Jr.
*Assistant Examiner*—James M. Mitchell
(74) *Attorney, Agent, or Firm*—Slater & Matsil, L.L.P.

(57) ABSTRACT

A method of stacking semiconductor chips includes providing four semiconductor chips that each include a top surface with central bond pads. Each of the bond pads is electrically coupled to second bond pads located in a peripheral portion of the semiconductor chip through a conductive layer. The first and the second semiconductor chips are arranged alongside one another on a carrier substrate. The second bond pads from the first and second semiconductor chips are bonded to corresponding landing pads on the substrate. The third semiconductor chip is then stacked over the first semiconductor chip and the fourth semiconductor chip over the second semiconductor chip. The second bond pads of the third and fourth semiconductor chips can then be bonded to contact pads of the substrate. The substrate can then be separated into a first stack that includes the first and third semiconductor chips and a second stack that includes the second and fourth semiconductor chips.

27 Claims, 3 Drawing Sheets

U.S. PATENT DOCUMENTS

| | | | |
|---|---|---|---|
| 6,607,940 B2 * | 8/2003 | Yasunaga ..................... 438/112 |
| 6,642,610 B2 * | 11/2003 | Park et al. .................. 257/678 |
| 6,683,385 B2 * | 1/2004 | Tsai et al. .................... 257/777 |
| 6,700,186 B2 * | 3/2004 | Yasunaga et al. ........... 257/672 |
| 6,709,893 B2 * | 3/2004 | Moden et al. ............... 438/113 |
| 6,815,746 B2 * | 11/2004 | Suzuki et al. ................ 257/296 |
| 6,841,881 B2 * | 1/2005 | Katagiri et al. .............. 257/777 |
| 7,071,574 B1 * | 7/2006 | Nojiri et al. ................. 257/784 |
| 2002/0027273 A1 * | 3/2002 | Huang ........................ 257/678 |
| 2002/0109216 A1 * | 8/2002 | Matsuzaki et al. ........... 257/686 |
| 2002/0197769 A1 * | 12/2002 | Choi, III .................... 438/109 |
| 2003/0006492 A1 * | 1/2003 | Ogasawara et al. ......... 257/684 |
| 2003/0020151 A1 | 1/2003 | Chen et al. |
| 2003/0025188 A1 * | 2/2003 | Farnworth et al. .......... 257/686 |
| 2003/0032263 A1 * | 2/2003 | Nagao et al. ................ 438/462 |
| 2003/0049882 A1 * | 3/2003 | Yin et al. .................... 438/106 |
| 2003/0062628 A1 * | 4/2003 | Lee et al. .................... 257/777 |
| 2003/0094683 A1 * | 5/2003 | Poo et al. .................... 257/686 |
| 2003/0099097 A1 * | 5/2003 | Mok et al. ................... 361/767 |
| 2003/0153122 A1 | 8/2003 | Brooks |
| 2003/0160312 A1 | 8/2003 | Lo et al. |
| 2003/0203537 A1 | 10/2003 | Koopmans |

FOREIGN PATENT DOCUMENTS

| | | |
|---|---|---|
| JP | 11135714 | 5/1999 |
| JP | 2002-261233 | 9/2002 |

* cited by examiner

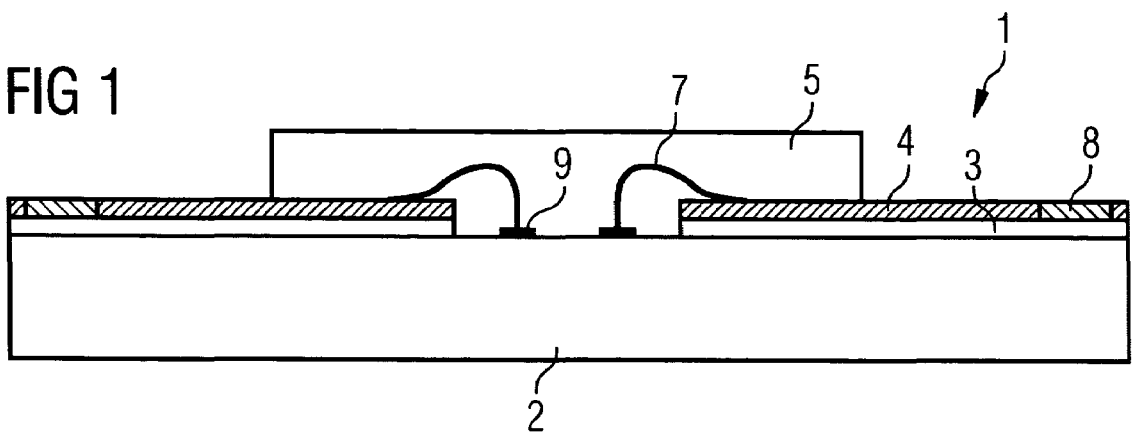
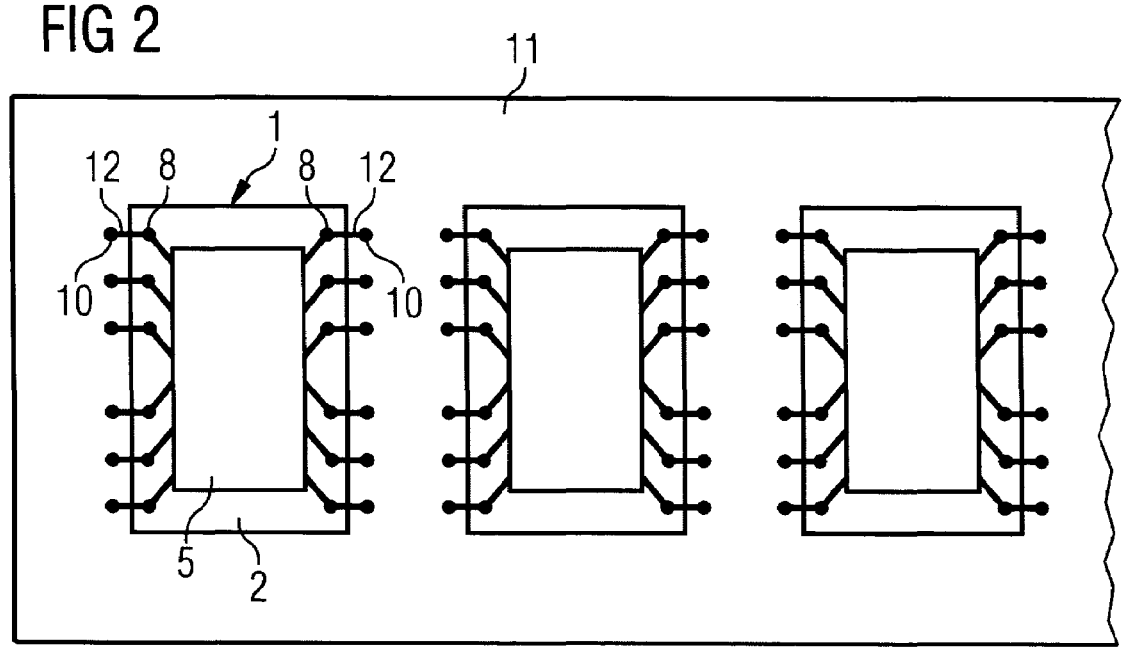

METHOD FOR MANUFACTURING A STACK ARRANGEMENT OF A MEMORY MODULE

This application relates to the following co-pending and commonly assigned patent application Ser. No. 10/701,742, filed Nov. 4, 2003, end entitled "Stack Arrangement of a Memory Module," which application is hereby incorporated herein by reference.

TECHNICAL FIELD

The preferred embodiment of the present invention pertains to a method of manufacturing a stack arrangement of a memory module in which at least two memory chips having central, first bond pads are directly stacked on a carrier substrate comprising conductor structures, contact pads and a flat ball grid array (FBGA) and electrically contacted with the carrier substrate vertically.

BACKGROUND

A generally known method for stacking memory chips is the stacking of two unpackaged components. Here the first memory chip is placed directly on the substrate by applying solder bumps made of solderable metal alloys onto the substrate metallization and the memory chip is electrically contacted to the substrate with its active side down (face-down) by means of a suitable bonding process. The second, upper memory chip is mounted mechanically with its active side up (face-up) on the back side of the lower memory chip. Electrical contact of the upper memory chip with the substrate is achieved by means of wire bond connections.

Since the bond pads of memory chips are arranged centrally and the electrical connections of each bonding row of the upper memory chip must be made on the same side as that of the lower memory chip, a particular disadvantage of this simultaneously face-up and face-down arrangement of memory chips with double and multiple rows of bond pads is the necessity to cross-wire bond connections in order to electrically contact the upper memory chips to one another, whereby wire bond connections up to 10 mm in length may be required. Since it is necessary to prevent both contact and mutual thermal and electrical influences of the wire bond connections, numerous technological problems result regarding the process and regarding the equipment.

Testing and burn-in can be done only after the electrical contacting of the two memory chips, and thus only after the memory arrangement is finished, by contacting the landing pads on the substrate with probes and applying alternating signals. Devices recognized as defective during the production process and the tests go into the rework loop. Testing only after production of the stack arrangement leads to a markedly higher loss rate and thus a considerably higher rework expense than usually occurs in the testing of individual components.

An additional disadvantage of this solution lies in the handling of the individual memory chips as stack components, which leads to high requirements in the production process, particularly with respect to positioning precision, orientation of the chips parallel to the substrate, and the temperature profiles of chip and substrate.

SUMMARY OF THE INVENTION

The preferred embodiment of the present invention is therefore based on the problem of presenting a method for producing a memory module by means of stacking and vertical contacting of suitable individual components that can be integrated cost-optimally into existing production and testing technology and reduces the loss rate of the assembled arrangements.

According to a first aspect of the invention, the problem is solved in that identical memory chips are used, the bond pads of which are electrically connected to a metallization on the active side of the memory chip, and the metallization comprises second bond pads in the edge area, in that the central area of the memory chip is provided with a protective compound (encapsulation) having an upper termination, in that the memory chips are arranged one alongside the other face-up on a dielectric substrate strip comprising landing pads, in that the second bond pads are electrically connected to the corresponding landing pads by bond connecting means and in that, on each individual component thus arranged, at least one additional individual component is stacked face-up in the same manner and contacted with the substrate strip. Subsequently, the substrate strip, now having several identical stacks of individual components, is placed face-down on the carrier substrate such that the first stack comes to rest on a defined part of the carrier substrate, and this section of the substrate strip, nearly the size of a memory chip, is cut off and thus the bond connecting means between the second bond pads and the landing pads are severed, whereby free ends of the bond connecting means are produced, which are then taken up by a suitable bonding tool and bonded to the corresponding contact pads of the carrier substrate.

The metallization, like the encapsulation of the central areas of the memory chip, can be produced by known methods. As a metallization, reroute layers are known, for the production of which various deposition and structuring methods find use depending on the characteristics required of the conductor systems and the bond pads, in particular their mechanical, electrical or surface and structural characteristics; as well as interposers comprising lead systems. For the encapsulation, possible methods include printing, meaning the application of the molding compound by means of silk screen printing; molding, the application of a multi-component epoxy resin system that is solid at room temperature; and application of a compound with the aid of a metering needle and compressed air. Likewise, various materials and methods of known technologies can find use for bond connections. The rerouting of the central bond pads of the memory chips to the peripheral area and the production of the encapsulation, which functions within the stack arrangement as a spacer, permits the stacking of individual components with identical orientation, whereby stack arrangements can be produced that permit short, direct electrical connections to the substrate strip and subsequently to the carrier substrate, and thus yield short signal transit times. This effect can even be amplified by the facedown stacking of the individual components.

Since stacking of the individual components is done by fastening the inactive back side of a memory chip to the encapsulation of the memory chip beneath it, a planar upper termination of the encapsulation is necessary. The latter holds a layer for adhering the individual components, for instance, an adhesive tape or a printed thin layer of adhesive material. Alternatively, a self-adhesive material that takes over the fixation of the individual components can be used for the encapsulation.

The handling of the individual components is considerably improved with the arrangement of the stacks on a substrate strip in an intermediate step so as to place them face-down at a defined position on the carrier substrate, which, among other things, again influences the effectiveness of the production process and the reliability of the contacting, both mechanical and electrical. For instance, the parallel orientation of individual components and the substrate can be improved in this way. Additionally, because of the cutting off of a section of the substrate strip and the simultaneous severing of the bond connections between the outer bond pads of the metallization and the landing pads of the substrate strip, free ends of the bond connecting means of defined length and position are available, which allow the use of a comb-like bonding tool that can effect bonding of all the separated ends in a single step. Depending on the requirements of the production process and the memory module, however, a simplified tool with a guide comparable to a swallow's tail is also possible. In particular, wire bond, lead bond or TAB connections can be used as bond connecting means, and US friction soldering as well as thermocompressive welding methods can be used for bonding.

Alongside the applicability of standard methods and thus standard equipment, another advantage of the invention is its protection of the electrical connections between the bond pads of the memory chips and the metallization by the encapsulation during the additional process steps of stack production. Therefore, in a particularly advantageous design of the invention, each individual component can be subjected to burn-in and subsequent tests before stacking, which allows a marked reduction in the loss rate of the assembled stack arrangements.

In another embodiment of the invention, a dielectric is applied to the back of each memory chip before production of the electrical connection between the first bond pads and the metallization and before production of the encapsulation. This additional layer improves the electrical isolation between the individual components and thus brings about a higher reliability of the memory module.

A particularly effective method is represented by a configuration of the invention that is characterized in that the separation of a section of the substrate strip with a stack arranged thereon that has been placed and fastened face-down on the carrier substrate, the severing of the bond connecting means, and the electrical connection of the stacked individual components to the carrier substrate at the severance points of the individual bond connecting means are carried out in a single work step by means of a suitable tool and a suitable bonding technology. This tool could be a punch bonding tool on which comb-like elements are present that can keep the bond connecting means separate and guide them. Immediately after punching-out of the substrate strip, this punch bonding tool presses the bond connecting means against the carrier substrate and creates the bond connections with one of the aforementioned methods.

In one configuration of the invention, the contact pads of the carrier substrate are designed to be elevated in comparison to the surrounding substrate in order to achieve a higher reliability of the bond connections, with, subsequently or alternatively, a security bond being produced on each contact pad after bonding. The construction of the contact pads as pedestals is possible by means of a lithographic process with electroplating or by previously forming bumps on the carrier substrate.

The face-down arrangement permits another possible procedure of the invention—the direct contacting of the preassembled stack arrangement on the substrate strip via suitable methods, particularly solder or friction weld joints. Thus it is possible to optimize the production process in the sense that, in particular, all contacts to the metallization can be produced in parallel.

To protect the stack arrangement and the electrical contacts from environmental influences that could cause failure of the component, as well as for electrical isolation and handling, the object of the invention can be provided with a package. Here too, known methods can be used, such as ceramic or plastic packaging technologies or the application of a molding compound that, depending on the epoxy resin system used, is cast at room temperature or at a defined processing temperature and exhibits, for instance, good mechanical and chemical resistance.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 shows the cross section of an individual component;

FIG. 2 shows the view of a strip substrate from above;

DETAILED DESCRIPTION OF ILLUSTRATIVE EMBODIMENTS

Figure 3:
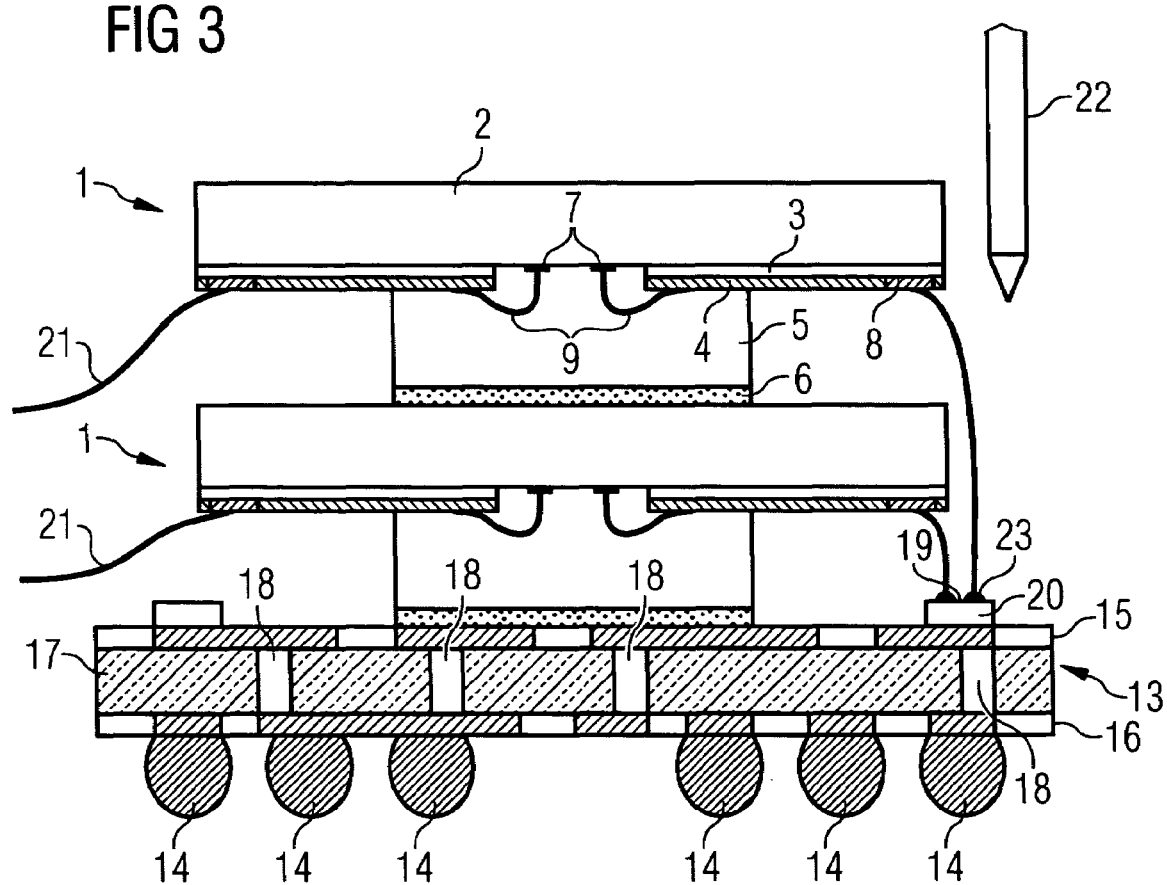
FIG. 3 shows the cross section of a stack arrangement.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

An individual component 1 that is used for producing a stack arrangement of a memory module is shown in FIG. 1. In this example, a memory chip 2 with a double row of central first bond pads 7 serves as the base component. On the active side of memory chip 2, a metallization 4 is created comprising an interposer 3 on which electrical conductor structures are produced by a suitable process, not shown, with second bond pads 8 present in the peripheral area. Metallization 4 is electrically connected by means of wire bond connections 9 to first bond pads 7 of the memory chip. A molding compound 5 of an epoxy resin system with a flat upper surface that completely encloses first bond pads 7 and wire bond connections 9, but leaves bond pads 8 free, is applied to the central area of memory chip 2, including wire bond connections 9.

As illustrated in FIG. 2, individual component 1 is glued in series with additional identical components 1 face-up on a substrate strip 11. Subsequently, second bond pads 8 are electrically connected to the corresponding landing pads 10 of substrate strip 11 by means of wire bridges 12 that serve as bond connecting means. An adhesive layer 6 (see e.g., FIG. 3) is subsequently applied to encapsulation 5 by printing and an additional identical individual component 1 is fixed in place on each individual component 1 arranged on substrate strip 11 and likewise contacted by means of wire bridges 12 to landing pads 10.

In FIG. 3, on a carrier substrate 13 that comprises an FBGA 14, an upper structured copper layer 15 and a lower one 16, a laminate 17 and passages 18 through the laminate 17 for connecting upper copper layer 15 to lower one 16, and thus indirectly to FBGA 14; pedestals 20 for accommodating the stack arrangement and corresponding to landing pads 10 are produced by means of photolithographic processes with electroplating, and contact pads 19 are placed on them. The above-described substrate strip 11 is now placed face-down at a defined point of the carrier substrate 13 that has been thus prepared, and fixed in place by means of adhesive 6 printed onto encapsulation 5 of the now lowermost individual component 1. A section that nearly matches the outline of the thus-prepared stack arrangement is then punched out of substrate strip 11 with a suitable punching tool, not shown. As a consequence of the punching, wire bridges 12 (see FIG. 2) are simultaneously cut, so that free ends 21 of wire bridges 12 result. The section of substrate strip 11 is then removed from the back side of the now uppermost individual component 1 of the separated stack arrangement.

As shown in FIG. 3, free ends 21 of wire bridges 12 are captured, kept separate, and guided with a comb-like bonding tool 22 and are bonded to the corresponding contact pad 19; a security bond 23 is then placed on each bond terminal.

Figure 4:
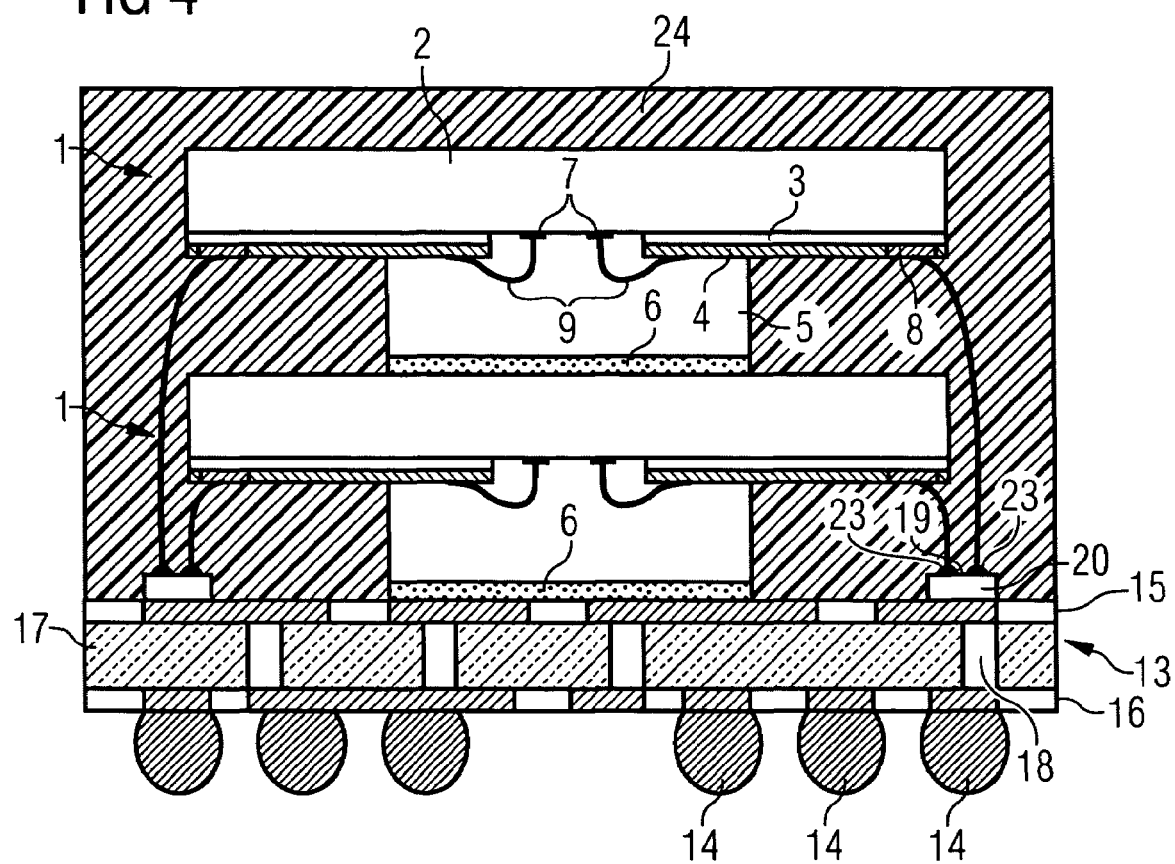
FIG. 4 shows the cross section of a packaged stack arrangement.

The stack arrangement is then surrounded by a packaging element 24, as shown in FIG. 4.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of stacking semiconductor chips, the method comprising:
   providing first, second, third and fourth semiconductor chips, each semiconductor chip including a top surface having central wire bond pads formed in a central portion thereof, each of the wire bond pads being electrically coupled to second wire bond pads located in a peripheral portion of the top surface of the semiconductor chip through a conductive layer, each semiconductor chip further including an encapsulation material overlying the central portion, each semiconductor chip including a bottom surface, which is opposite the top surface;
   arranging the first and the second semiconductor chips alongside one another on a substrate that includes a plurality of wire bond landing pads on a top surface of the substrate, wherein the bottom surfaces of the semiconductor chips are placed on the top surface of the substrate;
   electrically connecting second wire bond pads from the first and second semiconductor chips to corresponding wire bond landing pads on the substrate;
   stacking the third semiconductor chip over the first semiconductor chip and the fourth semiconductor chip over the second semiconductor chip;
   bonding the second wire bond pads of the third and fourth semiconductor chips to wire bond landing pads of the substrate; and
   cutting the substrate to separate a first stack that includes the first and third semiconductor chips from a second stack that includes the second and fourth semiconductor chips, wherein cutting the substrate includes severing the wire bonds between the second wire bond pads of the third and fourth semiconductor chips and the wire bond landing pads to create free ends of the wire bonds.

2. The method of claim 1, further comprising separating and capturing the free ends with a bonding tool and bonding the free ends to wire bond landing pads of a carrier substrate.

3. The method of claim 1 wherein the first stack is substantially the size of the first semiconductor chip.

4. The method of claim 1 wherein the first, second, third and fourth semiconductor chips each comprise a memory chip.

5. The method of claim 1 and further comprising subjecting the first, second, third and fourth semiconductor chips to burn-in and testing before stacking.

6. The method of claim 1 wherein the stacking the third semiconductor chip over the first semiconductor chip comprises adhering a back side of the third semiconductor chip directly to a flat upper portion of the encapsulation of the first semiconductor chip.

7. The method of claim 1 wherein the contact pads of the substrate are elevated relative to surrounding portions of the substrate surface.

8. The method of claim 1 and further comprising forming a security bond on each contact pad after bonding.

9. The method of claim 1 and further comprising providing the first stack and the second stack with a packaging element.

10. The method of claim 9 wherein the packaging element is formed from a molding compound.

11. The method of claim 1, wherein cutting the substrate includes severing the bonds between the second bond pads of the first and second semiconductor chips and the landing pads to create free ends of the bonds.

12. A method of stacking semiconductor chips, the method comprising:
   providing first, second, third and fourth semiconductor chips, each semiconductor chip including a top surface having central wire bond pads formed in a central portion thereof, each of the wire bond pads being electrically coupled to second wire bond pads located in a peripheral portion of the semiconductor chip through a conductive layer, each semiconductor chip further including an encapsulation material overlying the ventral portion;
   arranging the first and the second semiconductor chips alongside one another on a substrate that includes a plurality of wire bond landing pads;
   electrically connecting second wire bond pads from the first and second semiconductor chips to corresponding wire bond landing pads on the substrate;
   stacking the third semiconductor chip over the first semiconductor chip and the fourth semiconductor chip over the second semiconductor chip;
   bonding the second wire bond pads of the third and fourth semiconductor chips to wire bond landing pads of the substrate;
   cutting the substrate to separate a first stack that includes the first and third semiconductor chips from a second stack that includes the second and fourth semiconductor chips, wherein cutting the substrate includes severing the wire bonds between the second wire bond pads of the third and fourth semiconductor chips and the wire bond landing pads to create free ends of the wire bonds; and
   separating and capturing the free ends with a bonding tool and bonding the free ends to wire bond landing pads of a carrier substrate;

wherein cutting the substrate, severing the wire bonds, and bonding the free ends are carried out in a single work step by means of a suitable tool and a suitable bonding technology.

13. A method of manufacturing a stack arrangement of a memory module, the method comprising:
arranging a plurality of identical memory chips face-up alongside one another on a dielectric substrate strip having landing pads, each of the identical memory chips including central bond pads that are electrically coupled to second bond pads located in a peripheral portion of the memory chip through a metallization layer that overlies an interposer over an active side of the memory chip, each memory chip further including an encapsulation material overlying a central area of the memory chip, the encapsulation material having an elevation and a flat upper termination;
electrically connecting second bond pads from ones of the plurality of memory chips to corresponding landing pads on the substrate strip via wire bond connecting;
stacking at least one additional individual component face-up over each of the memory chips and electrically coupling the at least one component to the substrate strip;
separating a first stack that includes one of the memory chips and at least one additional component from the substrate strip, the first stack being substantially the size of a memory chip, wherein bond wires connected between the second band pads and the landing pads are severed and free ends of the bond wires result, the free ends being separated and captured with a suitable bonding tool and wire bonded to corresponding contact pads of a carrier substrate.

14. The method of claim 13 wherein the memory chips are subjected to burn-in and testing before stacking.

15. The method of claim 13 wherein the stacking is performed by adhering each individual component by its back side directly to the flat upper termination of encapsulation of the respective memory chip.

16. The method of claim 13 wherein a dielectric is applied to the back side of each memory chip before production of the electrical connection between first bond pads and the metallization and before production of encapsulation.

17. The method of claim 13 wherein the separation of the first stack, the severing of the bonds between the second bond pads and the landing pads, and the bonding to the corresponding contact pads of the substrate strip are carried out in a single work step by means of a suitable tool and a suitable bonding technology.

18. The method of claim 13 wherein the contact pads of the substrate strip are elevated in comparison to the surrounding substrate surface.

19. The method of claim 13 and further comprising forming a security bond on each contact pad after bonding.

20. The method of claim 13 wherein the memory chip is directly connected to contact pads of the substrate strip.

21. The method of claim 13 wherein the first stack comprises a memory module that is provided with a packaging element.

22. The method of claim 21 wherein the packaging element is fanned from a molding compound.

23. A method of manufacturing a stacked semiconductor package, the method comprising:
arranging a plurality of identical semiconductor chips face-up alongside one another on a substrate strip having landing pads, each of the identical semiconductor chips including bond pads located in a peripheral portion of the semiconductor chip;
connecting bond pads from ones of the plurality of semiconductor chips to corresponding landing pads on the substrate strip via wire bond connecting;
stacking at least one additional component over each of the semiconductor chips;
bonding the at least one additional component to the substrate strip via bond connecting;
separating a first stack that includes one of the semiconductor chips and at least one additional component from the substrate strip, wherein bond wires connected between the bond pads and the landing pads and bond wires connected between the at least one additional component and the substrate strip are severed and free ends of the bond wires result, the free ends being separated and captured with a suitable bonding tool and bonded to corresponding contact pads of a carrier substrate.

24. The method of claim 23, wherein the at least one additional component comprises a semiconductor chip that is identical to the plurality of the identical semiconductor chips.

25. The method of claim 24, wherein the identical semiconductor chips comprise identical memory chips, each of the identical memory chips including central bond pads that are electrically coupled to said bond pads located in the peripheral portion of the memory chip through a metallization layer that overlies an interposer over an active side of the memory chip.

26. The method of claim 25, wherein each memory chip further includes an encapsulation material overlying a central area of the memory chip, the encapsulation material having an elevation and a flat upper termination, wherein stacking at least one additional component over each of the semiconductor chips comprises adhering an inactive surface of a memory chip to the flat upper termination of encapsulation material of an underlying memory chip.

27. The method of claim 26, wherein separating a first stack comprises forming a first stack that is substantially the size of one of the identical memory chips.

* * * * *